(12) United States Patent
Yang et al.

(10) Patent No.: US 9,236,483 B2
(45) Date of Patent: Jan. 12, 2016

(54) FINFET WITH BACKGATE, WITHOUT PUNCHTHROUGH, AND WITH REDUCED FIN HEIGHT VARIATION

(71) Applicant: QUALCOMM Incorporated, San Diego, CA (US)

(72) Inventors: Bin Yang, San Diego, CA (US); Xia Li, San Diego, CA (US); Pr Chidambaram, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/179,311

(22) Filed: Feb. 12, 2014

(65) Prior Publication Data

US 2015/0228795 A1 Aug. 13, 2015

(51) Int. Cl.
*H01L 29/76* (2006.01)
*H01L 29/94* (2006.01)
*H01L 29/78* (2006.01)
*H01L 29/267* (2006.01)
*H01L 29/06* (2006.01)
*H01L 29/66* (2006.01)
*H03K 17/687* (2006.01)

(52) U.S. Cl.
CPC ........ *H01L 29/7855* (2013.01); *H01L 29/0607* (2013.01); *H01L 29/267* (2013.01); *H01L 29/66795* (2013.01); *H01L 29/7842* (2013.01); *H01L 29/7848* (2013.01); *H01L 29/7851* (2013.01); *H03K 17/687* (2013.01); *H03K 2017/6878* (2013.01); *H03K 2217/0018* (2013.01); *H03K 2217/0054* (2013.01)

(58) Field of Classification Search
CPC ................... H01L 29/66484; H01L 29/66742; H01L 29/7831; H01L 29/78645; H01L 29/8124

USPC ................................................. 257/365, 366
See application file for complete search history.

(56) References Cited

U.S. PATENT DOCUMENTS

2006/0197129 A1   9/2006 Wohlmuth
2006/0286724 A1  12/2006 Anderson et al.
2008/0224183 A1   9/2008 Nawaz
2008/0237636 A1  10/2008 Jin et al.
2009/0008705 A1   1/2009 Zhu et al.

(Continued)

FOREIGN PATENT DOCUMENTS

WO    2013101003 A1    7/2013

OTHER PUBLICATIONS

International Search Report and Written Opinion—PCT/US2015/015426—ISA/EPO—May 7, 2015.

(Continued)

*Primary Examiner* — Hoai V Pham
(74) *Attorney, Agent, or Firm* — Muncy, Geissler, Olds & Lowe, P.C.

(57) ABSTRACT

A FinFET having a backgate and a barrier layer beneath the fin channel of the FinFET, where the barrier layer has a bandgap greater than that of the backgate. The barrier layer serves as an etch stop layer under the fin channel, resulting in reduced fin channel height variation. The backgate provides improved current control. There is less punchthrough due to the higher bandgap barrier layer. The FinFET may also include deeply embedded stressors adjacent to the source/drain diffusions through the high bandgap barrier layer.

30 Claims, 6 Drawing Sheets

(56) References Cited

U.S. PATENT DOCUMENTS

| | | |
|---|---|---|
| 2010/0163926 A1 | 7/2010 | Hudait et al. |
| 2010/0252816 A1 | 10/2010 | Ko et al. |
| 2011/0227159 A1* | 9/2011 | Chan .................. H01L 21/7624 257/351 |
| 2012/0012932 A1 | 1/2012 | Perng et al. |
| 2013/0011983 A1 | 1/2013 | Tsai et al. |
| 2013/0049069 A1 | 2/2013 | Zhu et al. |
| 2013/0099282 A1 | 4/2013 | Chen et al. |
| 2013/0099283 A1 | 4/2013 | Lin et al. |
| 2013/0154007 A1 | 6/2013 | Cheng et al. |
| 2013/0234147 A1 | 9/2013 | Wu et al. |
| 2013/0285153 A1 | 10/2013 | Lee et al. |

OTHER PUBLICATIONS

Chen S.H., et al., "High-performance III-V MOSFET with Nano stacked high-k gate dielectric and 3D fin-shaped structure," Nanoscale Research Letters, 2012, vol. 7 (1), pp. 1-5.

\* cited by examiner

FINFET WITH BACKGATE, WITHOUT PUNCHTHROUGH, AND WITH REDUCED FIN HEIGHT VARIATION

FIELD OF DISCLOSURE

The invention relates to transistors, and more particularly, to a FinFET.

BACKGROUND

A FinFET transistor is a non-planar, FET (Field Effect Transistor) in which the channel has the appearance of a fin, thereby leading to its name. A FinFET is sometimes referred to as having a multi-gate or tri-gate architecture. FinFETs are of interest because, compared to conventional planar transistors, they can exhibit very low leakage current, and can better performance at the same power budget, or equivalent performance but at a lower power budget. However, some designs may lead to FinFETs with unwanted punchthrough and variations in fin height.

SUMMARY

Embodiments of the invention are directed to systems and methods for a FinFET with backgate, without punchthrough, and with reduced fin channel height variation.

In an embodiment, a device includes a substrate; a first layer formed over the substrate, the first layer comprising a first semiconductor; a second layer formed over the first layer, the second layer comprising a second compound semiconductor; and a fin channel formed over the second layer, the fin channel comprising a third semiconductor. The first compound semiconductor has a first bandgap and the third compound semiconductor has a third bandgap, and the second semiconductor has a second bandgap greater than the first bandgap and the second bandgap.

In another embodiment, a method includes: forming a first semiconductor layer over a substrate; forming a second semiconductor layer over the first semiconductor layer; forming a third semiconductor layer over the second semiconductor layer; and etching the third semiconductor layer to form a FinFET fin channel. The first, second, and third semiconductor layers each have, respectively, a first bandgap, a second bandgap, and a third bandgap, wherein the second bandgap is greater than the first bandgap and the second bandgap.

In another embodiment, a method to turn ON a FinFET includes: coupling a gate of the FinFET to a first rail; and coupling a first layer in the FinFET to a second rail, wherein the first layer is formed in a substrate of the FinFET and comprises a first semiconductor; wherein the gate is formed over a fin channel formed over a second layer, the second layer formed over the first layer and comprising a second semiconductor, the fin channel comprising a third semiconductor; wherein the first semiconductor has a first bandgap and the third semiconductor has a third bandgap, wherein the second semiconductor has a second bandgap greater than the first bandgap and the second bandgap.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/ or groups thereof.

Further, many embodiments are described in terms of sequences of actions to be performed by, for example, elements of a computing device. It will be recognized that specific circuits (e.g., application specific integrated circuits (ASICs)), one or more processors executing program instructions, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
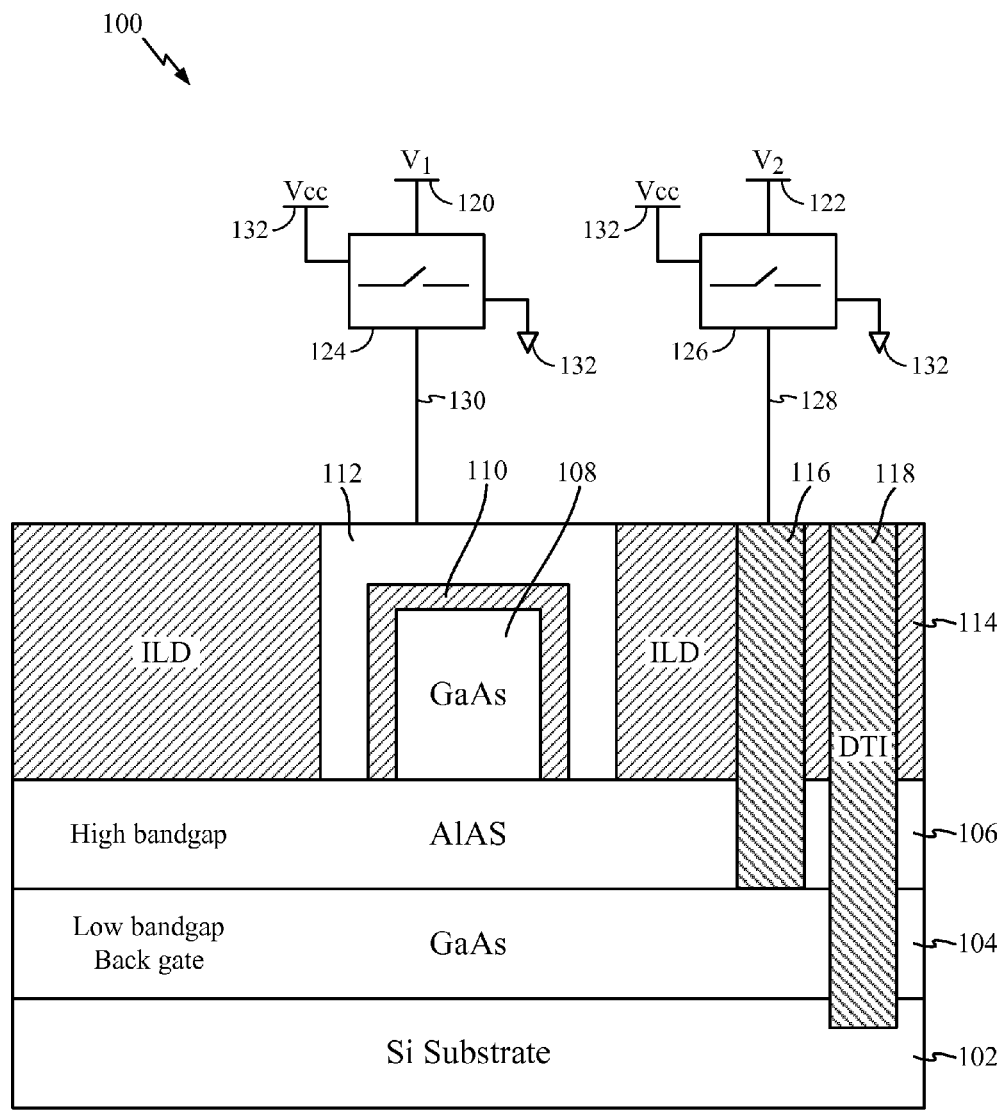
FIG. 1 is a cross sectional view of a FinFET according to an embodiment.

FIG. 1 is a simplified cross-sectional view of a FinFET 100 according to an embodiment. The cross-section is taken in a plane perpendicular to the FinFET channel, which is the channel 108 (to be discussed in more detail latter). Accordingly, the source and drain are not illustrated by the cross-section in FIG. 1 for they would be positioned in front of and behind the plane of the cross-section.

Formed on a substrate 102 is a layer 104 to provide a low bandgap backgate. For the particular embodiment of FIG. 1, the substrate 102 is silicon (Si) and the layer 104 is a semiconductor comprising GaAs. For other embodiments, the layer 104 may comprise various semiconductor elements or semiconductor compounds, such as III-V or II-VI semiconductor compounds, or group IV semiconductor elements or compounds such as for example Ge or SiGe. For some embodiments, the layer 104 has a bandgap in the range of 0.1 eV to 2 eV, with a thickness of about 0.5 micron. For some embodiments, for an n-type FinFET 100 the layer 104 is heavily p-type doped (p$^{++}$), with an example doping concentration in the range of $1·10^{19}$ cm$^{-3}$ to $1·10^{22}$ cm$^{-3}$. For some embodiments, for a p-type FinFET 100 the layer 104 is heavily n-type doped (n$^{++}$), with an example doping concentration in the range of $1·10^{19}$ cm$^{-3}$ to $1·10^{22}$ cm$^{-3}$. For some embodiments, the substrate 102 may be a material other than silicon. The thickness of the substrate 102 may be greater than 50 microns for some embodiments.

A layer 106 is formed above the layer 104. The layer 106 serves as an etch stop and helps mitigate punch through, and also serves as a barrier layer to the backgate formed by the layer 104. The layer 106 may be un-doped, lightly p-type doped for an n-type FinFET 100 with an example doping concentration in the range of $1·10^{13}$ cm$^{-3}$ to $1·10^{17}$ cm$^{-3}$, or lightly n-type doped for a p-type FinFET 100 with an example doping concentration backgate in the range of $1·10^{13}$ cm$^{-3}$ to $1·10^{17}$ cm$^{-3}$. For the particular embodiment of FIG. 1, the layer 106 is a semiconductor comprising AlAs, and is formed as a single crystal. For other embodiments, the layer 106 may comprise other semiconductors, such as for example III-V compounds.

The layer 106 has a bandgap higher than that of the layer 104. Accordingly, the terms "low bandgap" and "high bandgap" may be used to describe the layers 104 and 106, respectively. For some embodiments, the layer 106 has a bandgap in the range of 0.5 eV to 4 eV. For some embodiments, the layer 106 is highly resistive, providing a good electrical barrier, and may have a thickness of about 100 angstroms.

Above the layer 106 are formed other components to fabricate the FinFET 110. Illustrated in FIG. 1 are a channel 108, a gate dielectric 110, a gate 112, and an inter-layer dielectric 114. For the particular embodiment of FIG. 1, the channel 108 comprises GaAs with a relatively low bandgap. That is, the bandgap of the channel 108 is less than that of the layer 106, and may be comparable to the bandgap of the layer 104. For some embodiments, the channel 108 has a bandgap in the range of 0.1 eV to 2 eV. The channel 108 need not necessarily comprise the same material as that of the layer 104, and may comprise other semiconductor material, such as III-V or II-VI compounds.

For an n-type FinFET, where electrons are the majority carriers when the channel 108 is inverted, the channel 108 for some embodiments has a relatively high electron mobility; and for a p-type FinFET, where holes are the majority carriers when the channel 108 is inverted, the channel 108 for some embodiments has a relatively high hole mobility. For some embodiments, the channel 108 has a thickness in the range of 300 angstroms to 1000 angstroms.

The channel 108 is etched to form the fin structure. For ease of illustration, not all components making up the FinFET 100 are shown in FIG. 1. For example, source/drain diffusions are not shown because the view represented in FIG. 1 is along the channel 108 at a location between where the two source/drain diffusions would be fabricated.

By serving as an etch stop, the layer 106 allows for a reduction in height variation of the channel 108. That is, after a GaAs layer is formed on the layer 106, etching is applied to form the fin shape of the channel 108. The layer 106 stops the etch process at its surface, so that the height of the channel 108 is very well controlled, providing channel height uniformity from transistor to transistor.

With the bandgap of the layer 106 higher than that of the channel 108, it is expected that punchthrough (unwanted current flow from one of the source/drain diffusions to the other) is substantially reduced compared to prior art transistors. Furthermore, the layer 104 is used as a backgate, thereby providing increased channel current control. FIG. 1 shows a backgate contact 116 to the layer 104 to provide electrical contact to layer 104 so that it may be used as a backgate, where a trench is etched through the inter-layer dielectric 114 to the layer 104 followed by deposition of the conductive material. A backgate comprising the layer 104 enhances the ability to turn ON and OFF the FinFET 100 such that unwanted leakage current can be significantly reduced when the FinFET 100 is in the OFF state, and the desired ON state channel current can be increased when the FinFET 100 is in the ON state.

Voltages are provided to the gate 112 and to the layer 104 to turn the FinFET 100 ON or OFF, where the voltages depend upon the FinFET type. For example, to turn ON an n-type FinFET 100, a suitably chosen first positive voltage, represented by the voltage of the rail 120, may be applied to the gate 112, and a suitably chosen second positive voltage, represented by the voltage of the rail 122, may be applied to the layer 104 by way of the backgate contact 116. The functional units 124 and 126 represent circuit elements for coupling the gate 112 and the backgate contact 116 to their respective rails. The connecting lines 128 and 130 are simplifications for the various metal layers and vias (not shown for simplicity) that provide electrical connections to the gate 112 and the backgate contact 116. Also shown in FIG. 1 is a ground rail 132 to provide the ground (zero) voltage to the layer 104 and the gate 112. For an n-type FinFET 100, the gate 112 and the backgate contact 116 may be held at the ground voltage to turn OFF the FinFET 100.

The voltage for the rail 120 may be at a different value than the voltage for the rail 122, or they may be at the same value, in which case the rails 120 and 122 may be considered as constituting a single rail. One or both of these voltages may be at a different value than the HIGH voltage ($V_{CC}$), represented by the voltage of the power rail 132, used for other circuit elements.

For the case when the FinFET 100 is a p-type FinFET, the FinFET 100 may be turned ON when the functional units 124 and 126 are configured to coupled the gate 112 to the rail 120, and the backgate contact 116 to the rail 122, but now where the voltages of the rails 120 and 122 are suitably chosen for a p-type FinFET. For some embodiments, these voltages may be at the ground potential. Coupling the gate 112 and the backgate contact 116 to the power rail 132 may be performed to turn OFF the FinFET 100.

Figure 6:
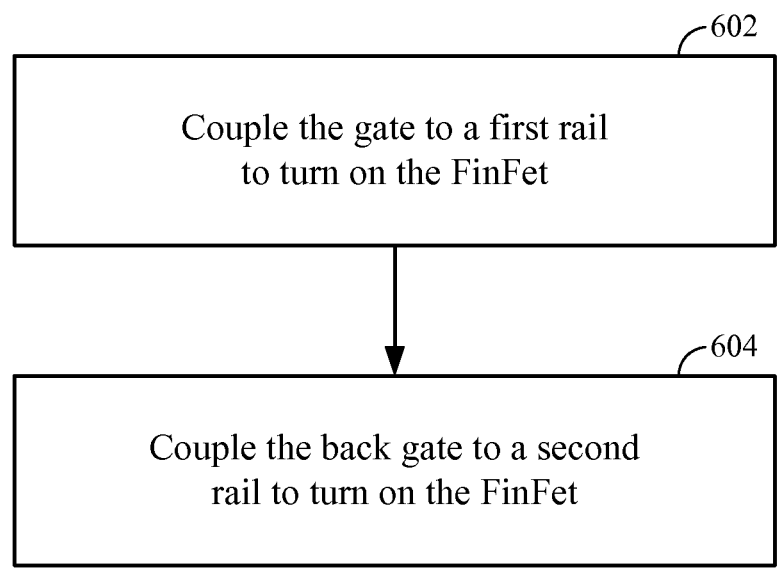
FIG. 6 illustrates coupling the gate and the backgate of a FinFET to their respective rails.

FIG. 6 illustrates the coupling of the gate 112 and the backgate contact 116 to their respective rails to turn ON the FinFET 100. In step 602, the gate (112) is coupled to a first rail (e.g., 120) to turn ON the FinFET 100. Coupling the backgate contact 166 to the rail 122 may be viewed as coupling the backgate of FinFET 100, where the backgate is identified with the layer 104. Using the backgate terminology for step 604, the backgate (104) is coupled to a second rail (e.g., 122) to turn ON the FinFET 100. Steps 602 need not necessarily be performed before step 604, and both steps may be performed at essentially the same time.

Illustrated in FIG. 1 is a deep trench isolation (DTI) region 118 to isolate both the layer 104 (the backgate) and the source/drain diffusions (not shown in FIG. 1) of the FinFET 100 from the backgate and source/drain diffusions of other active devices (not shown). For simplicity of illustration, only a portion of a DTI region is shown, but in practice the DTI region 118 extends or is repeated so as to electrically isolate all of the FinFET 100 structure from other active devices. Additional layers, such as passivation layers or other metallic layers, are formed above the structure indicated in FIG. 1, but such additional integrated layers are well known in the art and for simplicity of illustration are not shown.

Figure 2:
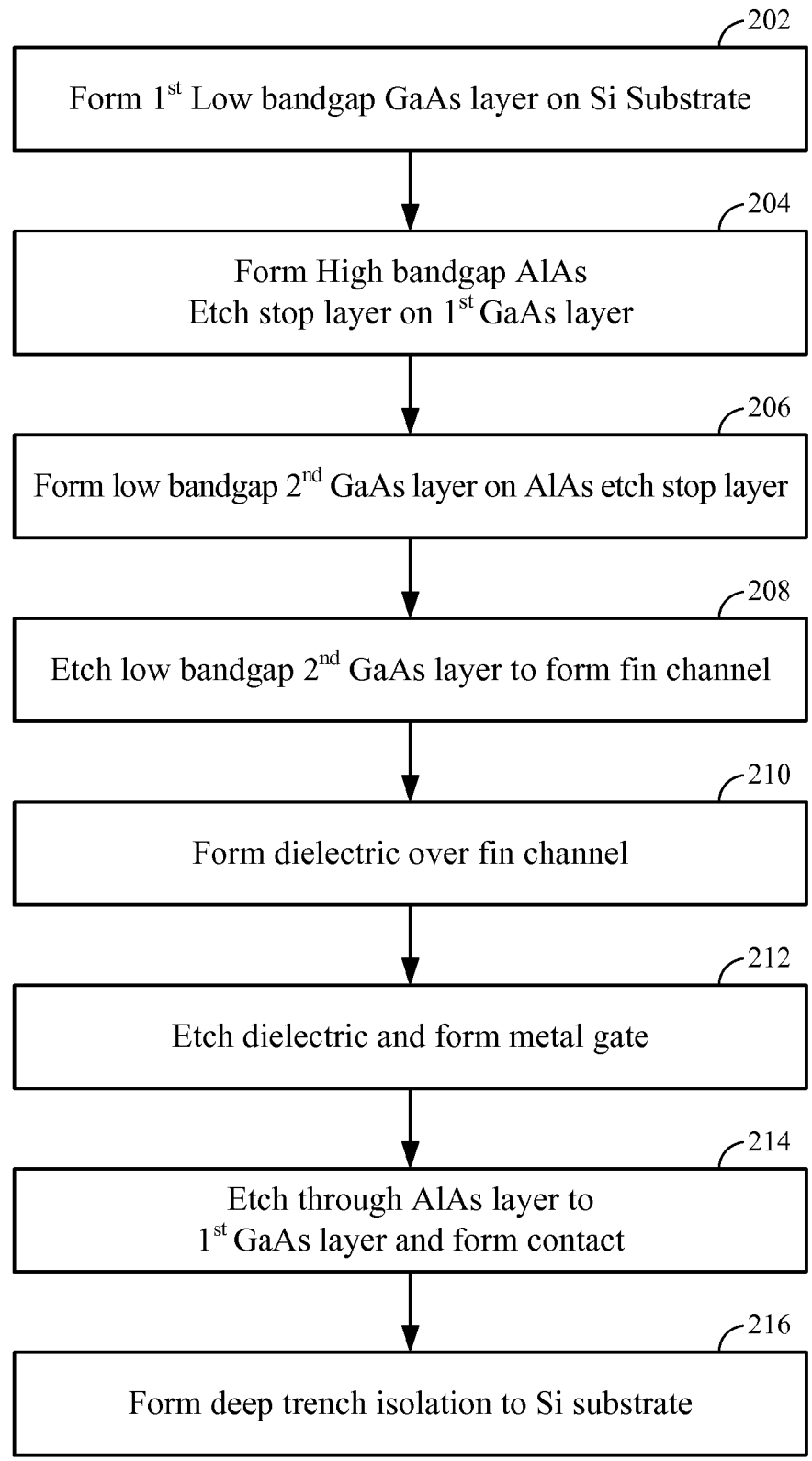
FIG. 2 is a process flow diagram according to an embodiment.

FIG. 2 illustrates a process flow diagram according to the embodiment discussed above. A low bandgap first GaAs layer is formed on a Si substrate (202), followed by forming a high bandgap AlAs etch stop layer on the first GaAs layer (204). A low bandgap second GaAs layer is formed on the AlAs etch stop layer (206), which is then etched to form a fin channel (208). A gate dielectric is formed over the fin channel (210), followed by etching and forming a metal gate (212). A trench is etched through the AlAs layer to the first GaAs layer and a backgate contact is formed (214), and a DTI region is formed down into the Si Substrate (216). Not all steps are shown in FIG. 2 that are needed to form an FinFET, but such additional steps are well known in the art.

Figure 3:
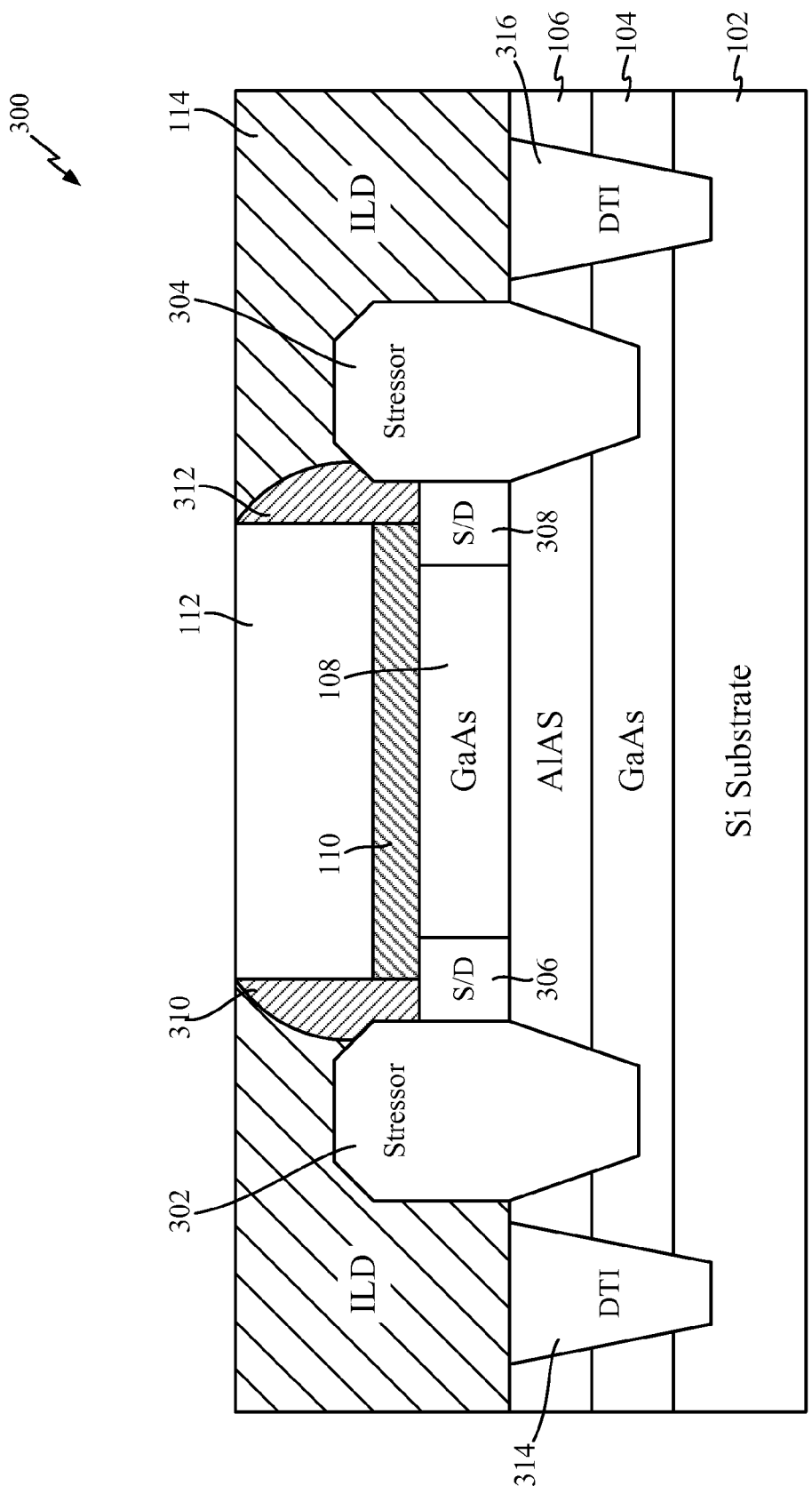
FIG. 3 is a cross-sectional view of a FinFET according to another embodiment.

Some embodiments may include stressors to increase the majority carrier mobility of the channel 108. FIG. 3 illustrates a cross-sectional view of a FinFET 300 with stressors 302 and 304. The cross-sectional view in FIG. 3 is taken in a plane along and parallel to the channel 108, and includes cross-sectional views of the source/drain diffusions 306 and 308. FIG. 3 also includes cross-sectional views of the sidewall spacers 310 and 312 and the DTI regions 314 and 316.

The composition of the stressors 302 and 304 will in general depend upon the material used for the channel 108, and whether the FinFET 300 is n-type (nMOS) or p-type (pMOS). For example, if the channel 108 is a Si channel, then for some embodiments the stressors 302 and 304 may comprise a silicon germanium alloy (SiGe) when the FinFET 300 is p-type, and may comprise a silicon carbide alloy (SiC) when the FinFET 300 is n-type. A SiGe alloy imparts a compressive stress to the channel 108 so as to increase hole mobility for a p-type FinFET, and a SiC alloy imparts a tensile stress to increase electron mobility for an n-type FinFET. The stressors 302 and 304 may be epitaxially grown, starting from the layer 106, or starting from the layer 104, and are embedded into the source/drain diffusions 306 and 308 as shown in FIG. 3. For channel material with III-V or II-V semiconductor compounds, Ge, SiGe, graphene or Carbon nanotubes, the stressors 302 and 304 may be different to maximize stressor benefits and enhance majority carrier mobility.

The stressors 302 and 304 can be grown on the layers 104 and 106 because these layers have a single crystal structure, that is, they each exhibit a uninform crystal lattice. This is to be compared to a conventional SOI (Silicon On Insulator) FinFET, which also has a barrier under its fin channel, but where the barrier is not a single crystal, such as for example a buried oxide layer (BOX). For such a conventional SOI FinFET, stressors cannot grow well through a BOX.

Because the layer 106 is a single crystal, the stressors 302 and 304 can be grown completely through the layer 106, and are relatively deeply embedded in the FinFET 300, resulting in a relatively large volume. A relatively large volume for the embedded stressors 302 and 304 helps contribute to an increase in the majority carrier mobility of the channel 108.

Figure 4:
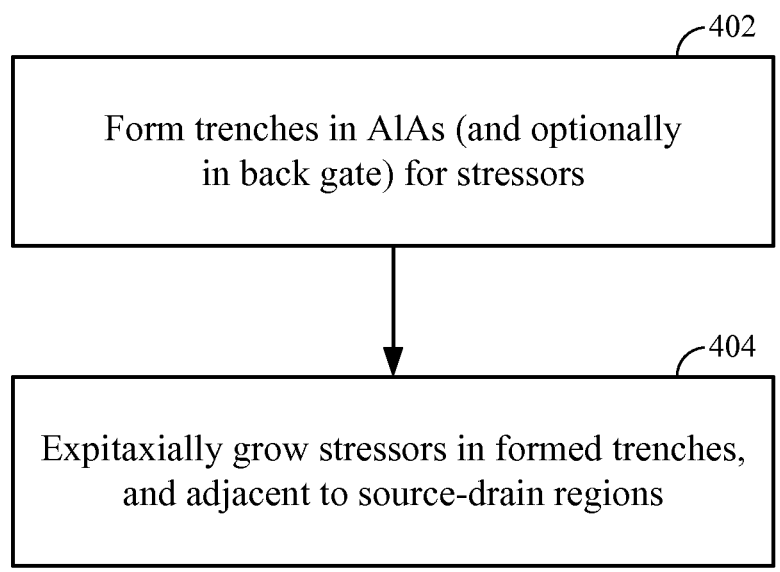
FIG. 4 is a process flow diagram according to another embodiment.

Accordingly, FIG. 4 illustrates process steps that may be added to the flow diagram of FIG. 2. In step 402, trenches are formed in the layer 106, followed by epitaxially growing the stressors in the formed trenches (404), and adjacent to the source/drain diffusions. The step 402 may include forming the trenches into the layer 104 as well.

Figure 5:
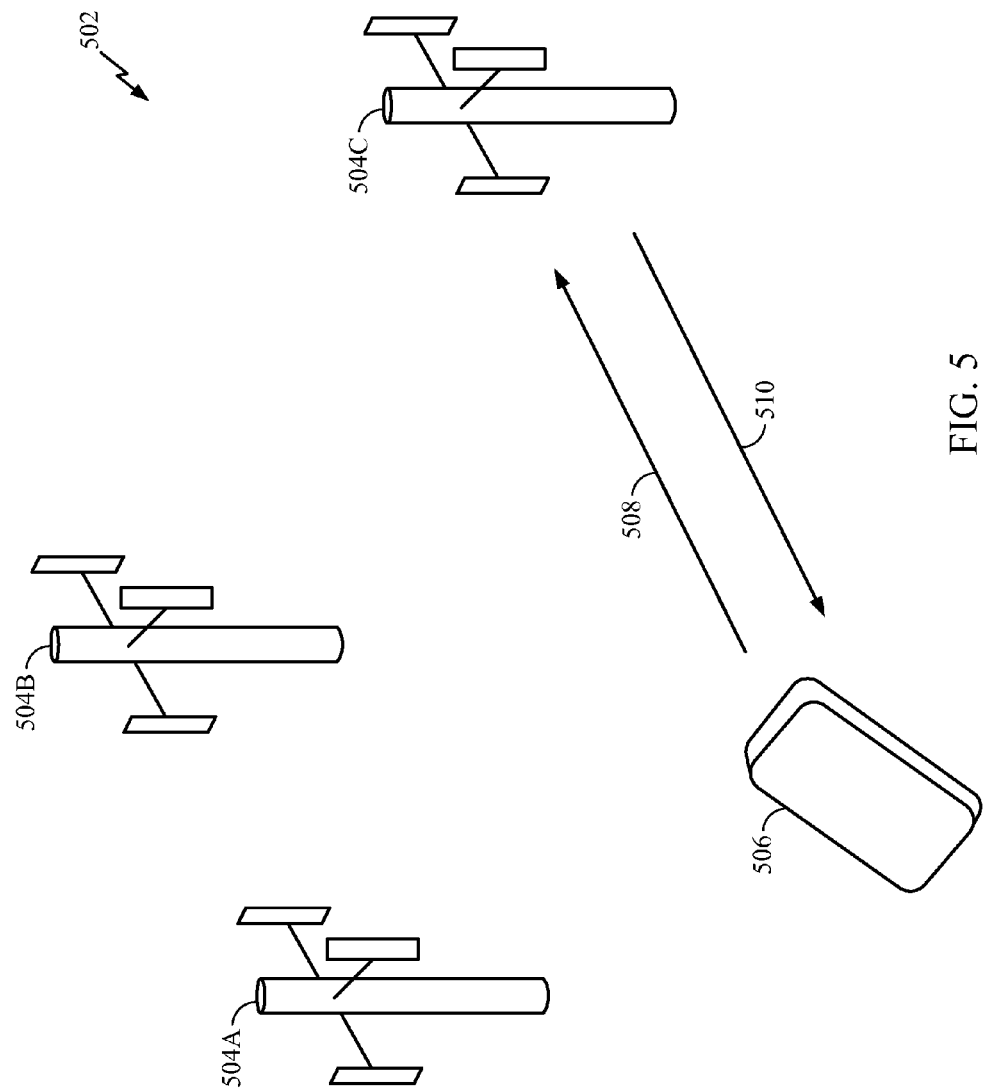
FIG. 5 illustrates a wireless communication system in which embodiments may find application.

FIG. 5 illustrates a wireless communication system in which embodiments may find application. FIG. 5 illustrates a wireless communication network 502 comprising base stations 504A, 504B, and 504C. FIG. 5 shows a communication device, labeled 506, which may be a mobile communication device such as a cellular phone, a tablet, or some other kind of communication device suitable for a cellular phone network, such as a computer or computer system. The communication device 506 need not be mobile. In the particular example of FIG. 5, the communication device 506 is located within the cell associated with the base station 504C. Arrows 508 and 510 pictorially represent the uplink channel and the downlink channel, respectively, by which the communication device 506 communicates with the base station 504C.

Embodiments may be used in data processing systems associated with the communication device 506, or with the base station 504C, or both, for example. FIG. 5 illustrates only one application among many in which the embodiments described herein may be employed.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for a FINFET with backgate, without punchthrough, and with reduced fin height variation. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A FinFET comprising:
a substrate;
a backgate comprising a first layer formed in the substrate, the first layer comprising a first semiconductor;
a second layer formed over the first layer, the second layer comprising a second semiconductor;
a fin channel formed over the second layer, the fin channel comprising a third semiconductor;
a backgate contact through the second layer and in electrical contact with the first layer;
a deep trench isolation region formed down into the substrate; and
wherein the first semiconductor has a first bandgap and the third semiconductor has a third bandgap, wherein the second semiconductor has a second bandgap greater than the first bandgap and the third bandgap.

2. The FinFET of claim 1, wherein the first, second, and third semiconductors are each selected form a group consisting of group III-V semiconductor compounds, group II-VI semiconductor compounds, group IV semiconductor elements or compounds, graphine, and carbon nanotubes.

3. The FinFET of claim 2, wherein the first and third semiconductors each comprise GaAs, and the second semiconductor comprises AlAs.

4. The FinFET of claim 1, wherein the first bandgap equals the third bandgap.

5. The FinFET of claim 1, further comprising:
a dielectric layer formed over the fin channel; and
a gate formed over the dielectric layer.

6. The FinFET of claim 5, further comprising:
a first rail coupled to the gate to provide a first voltage to turn ON the FinFET; and
a second rail coupled to the backgate contact to provide a second voltage to turn ON the FinFET.

7. The FinFET of claim 6, wherein the first rail and second rail are at a same voltage.

8. The FinFET of claim 1, further comprising:
a first stressor and a second stressor epitaxially grown in the second layer to provide stress to the fin channel.

9. The FinFET of claim 8, further comprising:
a first source/drain diffusion adjacent to the fin channel and adjacent to the first stressor; and
a second source/drain diffusion adjacent to the fin channel and adjacent to the second stressor.

10. The FinFET of claim 9, further comprising:
a first rail coupled to a gate to provide a first voltage to turn ON the FinFET; and
a second rail coupled to the backgate contact to provide a second voltage to turn ON the FinFET.

11. The FinFET of claim 1, wherein if the FinFET is n-type the first layer is heavily p-type doped with a doping concentration in a range of $1 \cdot 10^{19}$ cm$^{-3}$ to $1 \cdot 10^{22}$ cm$^{-3}$, and if the FinFET is p-type the first layer is heavily n-type doped with a doping concentration in the range of $1 \cdot 10^{19}$ cm$^{-3}$ to $1 \cdot 10^{22}$ cm$^{-3}$.

12. The FinFET of claim 11, wherein if the FinFET is n-type the second layer is lightly p-type doped with a doping concentration in the range of $1 \cdot 10^{13}$ cm$^{-3}$ to $1 \cdot 10^{11}$ cm$^{-3}$; and if the FinFET is p-type the second layer is lightly n-type doped with a doping concentration in the range of $1 \cdot 10^{13}$ cm$^{-3}$ to $1 \cdot 10^{17}$ cm$^{-3}$.

13. The FinFET of claim 11, wherein the second layer is un-doped.

14. The FinFET of claim 1, wherein the FinFET is used in a device selected from a group consisting of a cellular phone, a tablet, a computer system, and a base station.

15. A method to fabricate a FinFET, the method comprising:
forming a first semiconductor layer in a substrate;
forming a second semiconductor layer over the first semiconductor layer;
forming a third semiconductor layer over the second semiconductor layer;
etching the third semiconductor layer to form a FinFET fin channel;
etching through the second semiconductor layer to the first semiconductor layer and forming an electrical backgate contact to the first semiconductor layer; and
forming a deep trench isolation region to the substrate;
wherein the first, second, and third semiconductor layers each have, respectively, a first bandgap, a second bandgap, and a third bandgap, wherein the second bandgap is greater than the first bandgap and the third bandgap.

16. The method of claim 15, further comprising:
forming a dielectric layer over the FinFET fin channel; and
forming a gate over the dielectric layer.

17. The method of claim 15, wherein the first bandgap equals the third bandgap.

18. The method of claim 15, further comprising:
forming a first trench in the second semiconductor layer;
epitaxially growing a first stressor in the first trench to provide stress to the FinFET fin channel;
forming a second trench in the second semiconductor layer; and
epitaxially growing a second stressor in the second trench to provide stress to the FinFET fin channel.

19. The method of claim 18, wherein the first and second stressors are selected from a group consisting of a silicon germanium alloy (SiGe), a silicon carbide alloy (SiC), group III-V semiconductor compounds, group II-V semiconductor compounds, and group IV semiconductor elements or compounds.

20. The method of claim 18, further comprising:
epitaxially growing the first stressor adjacent to a first source/drain diffusion; and
epitaxially growing the second stressor adjacent to a second source/drain diffusion.

21. The method of claim 20, further comprising:
forming a dielectric layer over the FinFET fin channel; and
forming a gate over the dielectric layer.

22. The method of claim 18, further comprising:
forming the first trench in the first semiconductor layer; and
forming the second trench in the first semiconductor layer.

23. The method of claim 15, wherein the first, second, and third semiconductor layers are each selected form a group consisting of group III-V semiconductor compounds, group II-VI semiconductor compounds, group IV semiconductor elements or compounds, graphine, and carbon nanotubes.

24. The method of claim 23, wherein the first and third semiconductor layers each comprise GaAs, and the second semiconductor layer comprises AlAs.

25. The method of claim 15, wherein if the FinFET is n-type, p-type doping the first semiconductor layer with a doping concentration in a range of $1 \cdot 10^{19}$ cm$^{-3}$ to $1 \cdot 10^{22}$ cm$^{-3}$; and
if the FinFET is p-type, n-type doping the first semiconductor layer with a doping concentration in the range of $1 \cdot 10^{19}$ cm$^{-3}$ to $1 \cdot 10^{22}$ cm$^{-3}$.

26. The method of claim 25, wherein if the FinFET is n-type, p-type doping the second semiconductor layer with a doping concentration in the range of $1 \cdot 10^{13}$ cm$^{-3}$ to $1 \cdot 10^{17}$ cm$^{-3}$; and if the FinFET is p-type, n-type doping the second semiconductor layer with a doping concentration in the range of $1 \cdot 10^{13}$ cm$^{-3}$ to $1 \cdot 10^{17}$ cm$^{-3}$.

27. The method of claim 25, wherein the second semiconductor layer is un-doped.

28. A method to turn ON a FinFET, the FinFET comprising a gate, a backgate, and a substrate, the method comprising:

coupling the gate of the FinFET to a first rail;

coupling the backgate of the FinFET to a second rail, wherein the backgate comprises a first layer formed in the substrate and comprises a first semiconductor;

wherein the gate is formed over a fin channel formed over a second layer, the second layer formed over the first layer and comprising a second semiconductor, the fin channel comprising a third semiconductor; and forming a deep trench isolation region down into the substrate;

wherein the first semiconductor has a first bandgap and the third semiconductor has a third bandgap, wherein the second semiconductor has a second bandgap greater than the first bandgap and the third bandgap.

29. The method of claim 28, wherein the first and second rails are at a same voltage.

30. The method of claim 28, wherein the first bandgap and the third bandgap are equal to each other.

* * * * *